United States Patent
Enomoto et al.

(10) Patent No.: US 12,148,147 B2
(45) Date of Patent: Nov. 19, 2024

(54) SUBSTRATE INSPECTION DEVICE, SUBSTRATE INSPECTION METHOD, AND STORAGE MEDIUM

(71) Applicant: TOKYO ELECTRON LIMITED, Tokyo (JP)

(72) Inventors: Masashi Enomoto, Kumamoto (JP); Masato Hosaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 346 days.

(21) Appl. No.: 17/833,876

(22) Filed: Jun. 6, 2022

(65) Prior Publication Data
US 2022/0398708 A1 Dec. 15, 2022

(30) Foreign Application Priority Data
Jun. 11, 2021 (JP) ................. 2021-097785

(51) Int. Cl.
*G06T 7/00* (2017.01)
(52) U.S. Cl.
CPC .... *G06T 7/001* (2013.01); *G06T 2207/30148* (2013.01)
(58) Field of Classification Search
CPC ......... G06T 7/0004; G06T 2207/30148; G06T 7/001; G06T 2207/30164; G01N 21/9501; G01N 21/956; G01N 2021/8887; G01N 21/9503; G01N 21/9505; G01N 2223/6116; G01N 21/95607; G01N 2021/95615;
(Continued)

(56) References Cited

U.S. PATENT DOCUMENTS

| 2002/0031249 A1 * | 3/2002 | Komuro ............. G01N 21/9501 257/E21.53 |
| 2002/0084181 A1 * | 7/2002 | Gopalraja ............. C23C 14/046 204/192.12 |

(Continued)

FOREIGN PATENT DOCUMENTS

| CN | 101499434 A | * | 8/2009 | ......... G01N 21/8806 |
| CN | 111462056 A | * | 7/2020 | ............. G06T 5/002 |

(Continued)

OTHER PUBLICATIONS

Petri-Net and GA-Based Approach to Modeling, Scheduling, and Performance Evaluation for Wafer Fabrication—2001 (Year: 2001).*

*Primary Examiner* — Nizar N Sivji
(74) *Attorney, Agent, or Firm* — Nath, Goldberg & Meyer; Jerald L. Meyer; Tanya E. Harkins

(57) ABSTRACT

A substrate inspection device for inspecting a substrate, includes: a setting part configured to define a group according to a basic state that is not dependent on a presence or absence of a defect in a substrate and set the defined group for each inspection target substrate; an inspection part configured to perform a defect inspection based on a captured image of the inspection target substrate and an inspection recipe corresponding to the defined group to which the inspection target substrate belongs and including a reference image; a recipe creation part configured to create the inspection recipe for each group; and a determination part configured to perform a determination as to whether a group-setting target substrate, for which the group is set by the setting part, belongs to the group defined by the setting part.

18 Claims, 7 Drawing Sheets

(58) Field of Classification Search
CPC ............... G01N 21/01; G01N 21/8806; G01N 21/8851; G03F 7/7065; G03F 1/84; G03F 7/705; H01L 22/12; H01L 22/20
See application file for complete search history.

(56) References Cited

U.S. PATENT DOCUMENTS

| | | | | |
|---|---|---|---|---|
| 2004/0151362 | A1* | 8/2004 | Hamaguchi | G06T 7/0002 382/145 |
| 2006/0203230 | A1* | 9/2006 | Ohminami | G01N 21/94 356/237.1 |
| 2008/0250384 | A1* | 10/2008 | Duffy | G03F 7/70525 716/55 |
| 2009/0222753 | A1* | 9/2009 | Yamaguchi | G06T 7/0004 702/35 |
| 2009/0228217 | A1* | 9/2009 | Fukushima | G01N 21/956 702/35 |
| 2010/0158345 | A1* | 6/2010 | Kitamura | G06T 7/13 382/145 |
| 2012/0133913 | A1* | 5/2012 | Okita | G03F 7/70525 355/30 |
| 2012/0257041 | A1* | 10/2012 | Nakagaki | H01J 37/28 348/80 |
| 2013/0066454 | A1* | 3/2013 | Geshel | G06F 30/00 700/97 |
| 2014/0160451 | A1* | 6/2014 | Hasegawa | G03F 7/7065 355/40 |
| 2018/0143144 | A1* | 5/2018 | Mori | G01N 21/9501 |
| 2018/0156739 | A1* | 6/2018 | Mori | H01L 21/67742 |
| 2018/0229497 | A1* | 8/2018 | Darrow | B41J 25/308 |
| 2020/0375076 | A1* | 11/2020 | Suzuki | H05K 13/0882 |
| 2021/0103227 | A1* | 4/2021 | Den Boef | G03F 7/70616 |
| 2022/0171290 | A1* | 6/2022 | Onose | G03F 7/706841 |
| 2022/0203700 | A1* | 6/2022 | Chen | G06T 7/0004 |

FOREIGN PATENT DOCUMENTS

| | | |
|---|---|---|
| JP | 2014-115140 A | 6/2014 |
| JP | 2016-212008 A | 12/2016 |
| WO | 2020/246366 A1 | 12/2020 |

* cited by examiner

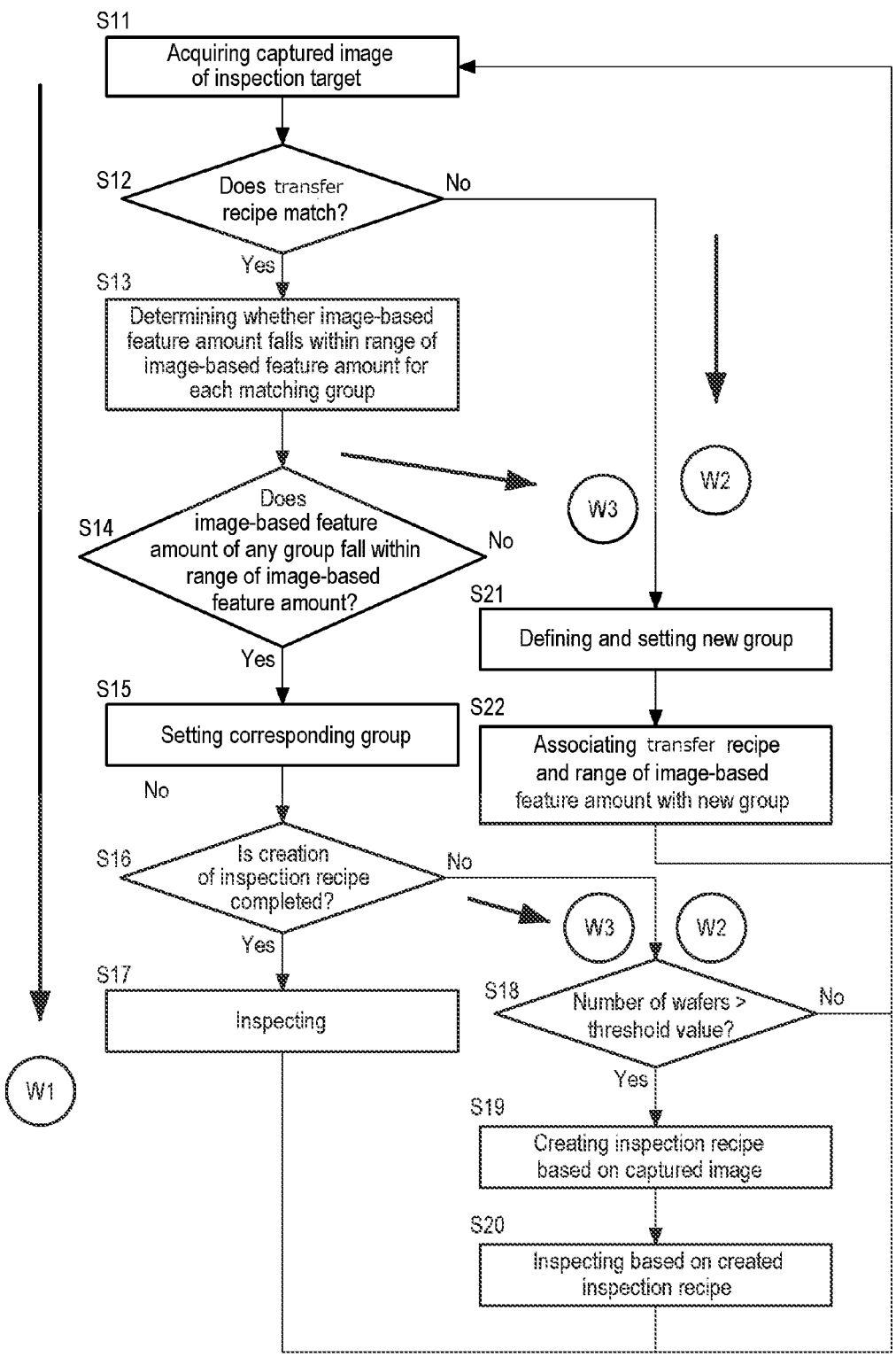

SUBSTRATE INSPECTION DEVICE, SUBSTRATE INSPECTION METHOD, AND STORAGE MEDIUM

CROSS-REFERENCE TO RELATED APPLICATION

This application is based upon and claims the benefit of priority from Japanese Patent Application No. 2021-097785, filed on Jun. 11, 2021, the entire contents of which are incorporated herein by reference.

TECHNICAL FIELD

The present disclosure relates to a substrate inspection device, a substrate inspection method, and a storage medium.

BACKGROUND

Patent Document 1 discloses an image pattern inspection method of detecting a defect by comparing an inspection target image pattern with a reference image pattern.

PRIOR ART DOCUMENT

Patent Document

Patent Document 1: Japanese Laid-Open Patent Publication No. 2016-212008

SUMMARY

According to one embodiment of the present disclosure, there is provided a substrate inspection device for inspecting a substrate, including: a setting part configured to define a group according to a basic state that is not dependent on a presence or absence of a defect in a substrate and set the defined group for each inspection target substrate: an inspection part configured to perform a defect inspection based on a captured image of the inspection target substrate and an inspection recipe corresponding to the defined group to which the inspection target substrate belongs and including a reference image; a recipe creation part configured to create the inspection recipe for each group; and a determination part configured to perform a determination as to whether a group-setting target substrate, for which the group is set by the setting part, belongs to the group defined by the setting part, wherein the determination part performs the determination based on: whether processes performed on the substrates match each other between the group-setting target substrate and the substrate that belongs to the defined group; and whether the basic state of the group-selling target substrate estimated from a captured image of the group-setting target substrate and the basic state of the substrate that belongs to the defined group match each other, when the group-setting target substrate is determined to belong to the defined group, the setting part sets the corresponding group for the group-setting target substrate, and when the group-setting target substrate is determined to not belong to the defined group, the setting part defines a new group and sets the new group for the group-setting target substrate, and the recipe creation part creates the inspection recipe corresponding to the new group based on a captured image of the group-setting target substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a flowchart illustrating an example of an inspection process by the overall control device.

DETAILED DESCRIPTION

Figure 1:
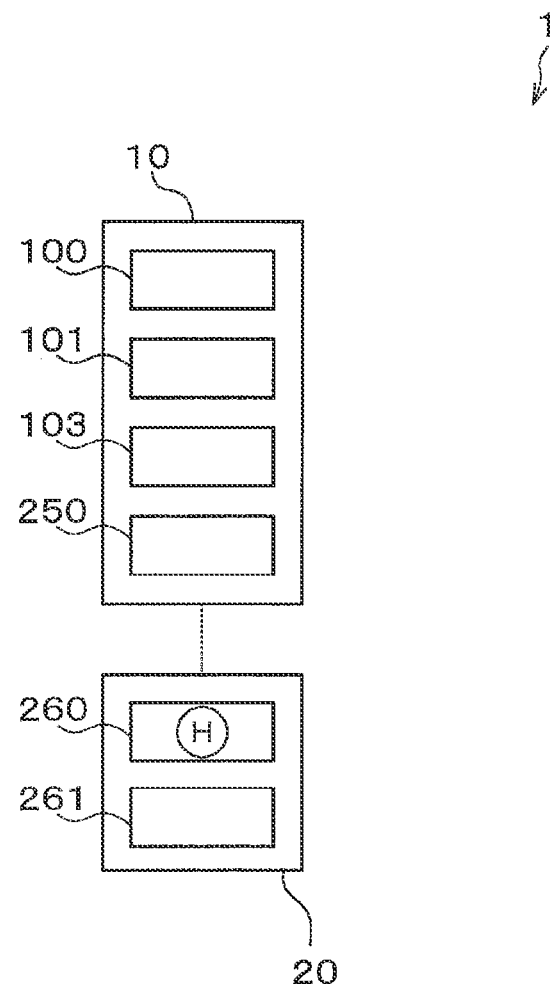
FIG. 1 is a view schematically illustrating an outline of a configuration of a wafer inspection system including an overall control device, as a substrate inspection device according to the present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a process of manufacturing semiconductor devices or the like, a resist coating process for forming a resist film by coating a semiconductor wafer (hereinafter referred to as a "wafer") with a resist liquid, an exposure process for exposing the resist film, a development process for developing the exposed resist film, and the like are sequentially performed, so that a resist pattern is formed on the wafer. Then, after firming the resist pattern, etching, or the like using the resist pattern as a mask is performed on an etching target layer, so that a predetermined pattern is formed on the etching target layer. When forming the resist pattern, a film other than the resist film may be formed under the resist film.

In addition, when forming a resist pattern or when performing etching by using the resist pattern as described above, defect inspection may be performed on the wafer after performing various processes. In this defect inspection, for example, whether the resist pattern is appropriately formed, whether foreign matter adheres to the water, and the like are inspected. In recent years, in this defect inspection, a captured image obtained by capturing an image of a processed inspection target wafer (specifically, a processed surface, i.e., a front surface of the wafer) may be used. In this case, the defect inspection is performed by comparing the captured image of the inspection target wafer with a reference image used as an inspection reference (see Patent Document 1).

The states of inspection target wafers may differ greatly depending on the types or the like of processes performed thereon so far, regardless of the presence or absence of a defect. For example, the states of wafers may differ greatly between before the development process in which no resist pattern is formed, that is, after the resist coating process, and after the development process in which a resist pattern is formed. In addition, even after the development process, when the exposure conditions are different, the shapes or pitches of resist patterns may differ. Even after the resist coating process, when the states or coating conditions of base films are different, the overall color tones or the color tones for respective places in the captured images of wafers may differ.

Therefore, unless a reference image corresponding to the state of an inspection target wafer is used, it is impossible to perform defect inspection based on a captured image of an inspection target water with accuracy. For example, when an appropriate reference image is not used, the contour of a resist pattern, which is not a defect, may be erroneously detected as a defect. That is, a pseudo defect may occur. Therefore, it is necessary to prepare a large number of reference images for each of various types of wafers in order to accurately perform defect inspection based on the captured image of the wafer. However, it is troublesome to prepare a large number of reference images when starting up an inspection device that performs defect inspection.

Therefore, the technique according to the present disclosure performs detect inspection based on a captured image of a substrate with high accuracy while suppressing an increase in effort at the time of startup.

Hereinafter, a substrate inspection device and a substrate inspection method according to the present embodiment will be described with reference to the drawings. In the specification and drawings, elements having substantially the same functional configurations will be denoted by the same reference numerals and redundant descriptions will be omitted.

<Wafer Processing System and Inspection Capturing Device>

FIG. 1 is a view schematically illustrating an outline of a configuration of a wafer inspection system including an overall control device, as a substrate inspection device according to the present embodiment.

As illustrated in the drawing, a wafer inspection system 1 includes a wafer processing system 10 and an overall control device 20.

The wafer processing system 10 processes a wafer as a substrate and, in the present example, performs, on a wafer, a process for forming a resist pattern on a wafer or the like.

Figure 2:
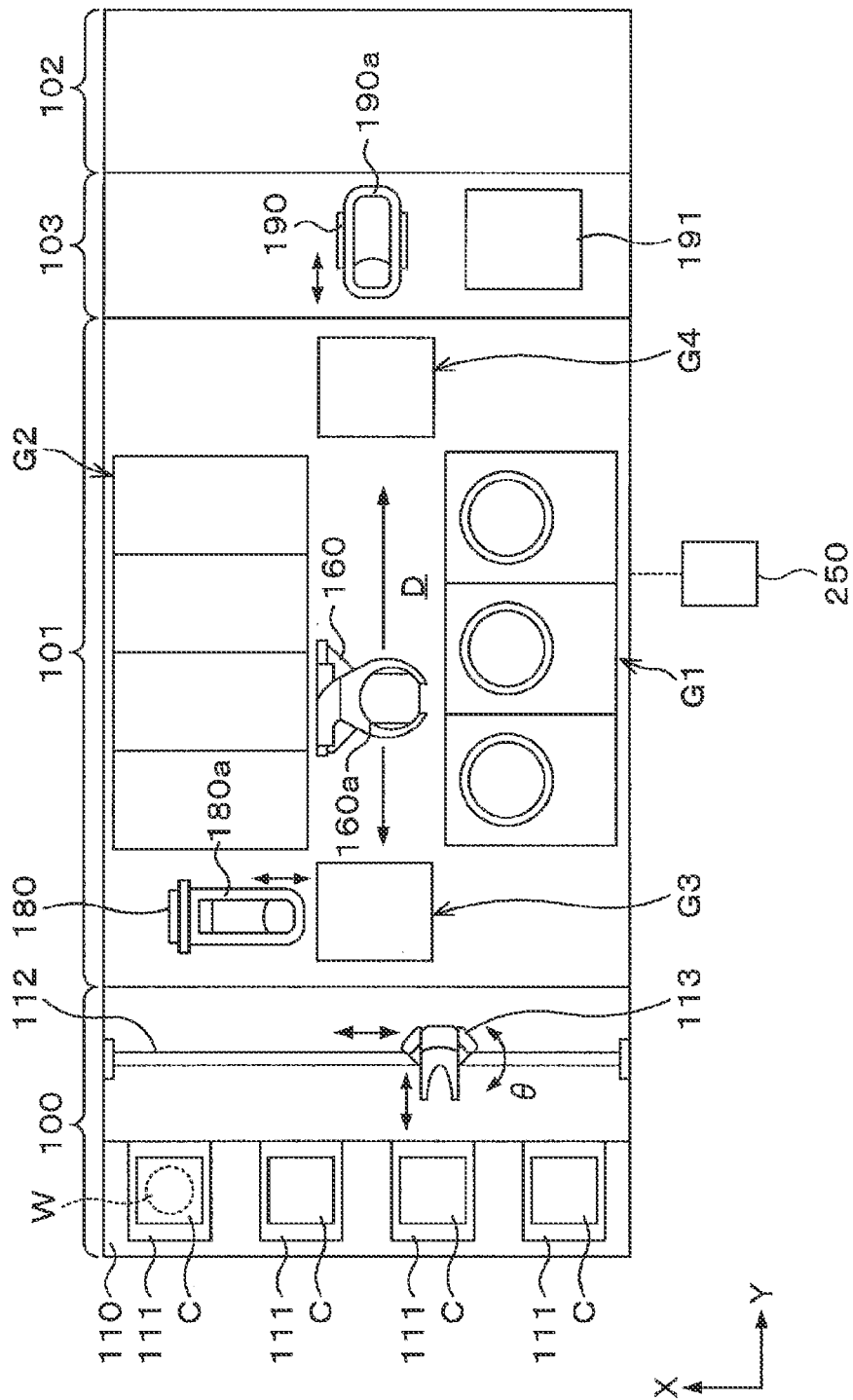
FIG. 2 is a plan view schematically illustrating an outline of a configuration of a wafer processing system.
Figure 3:
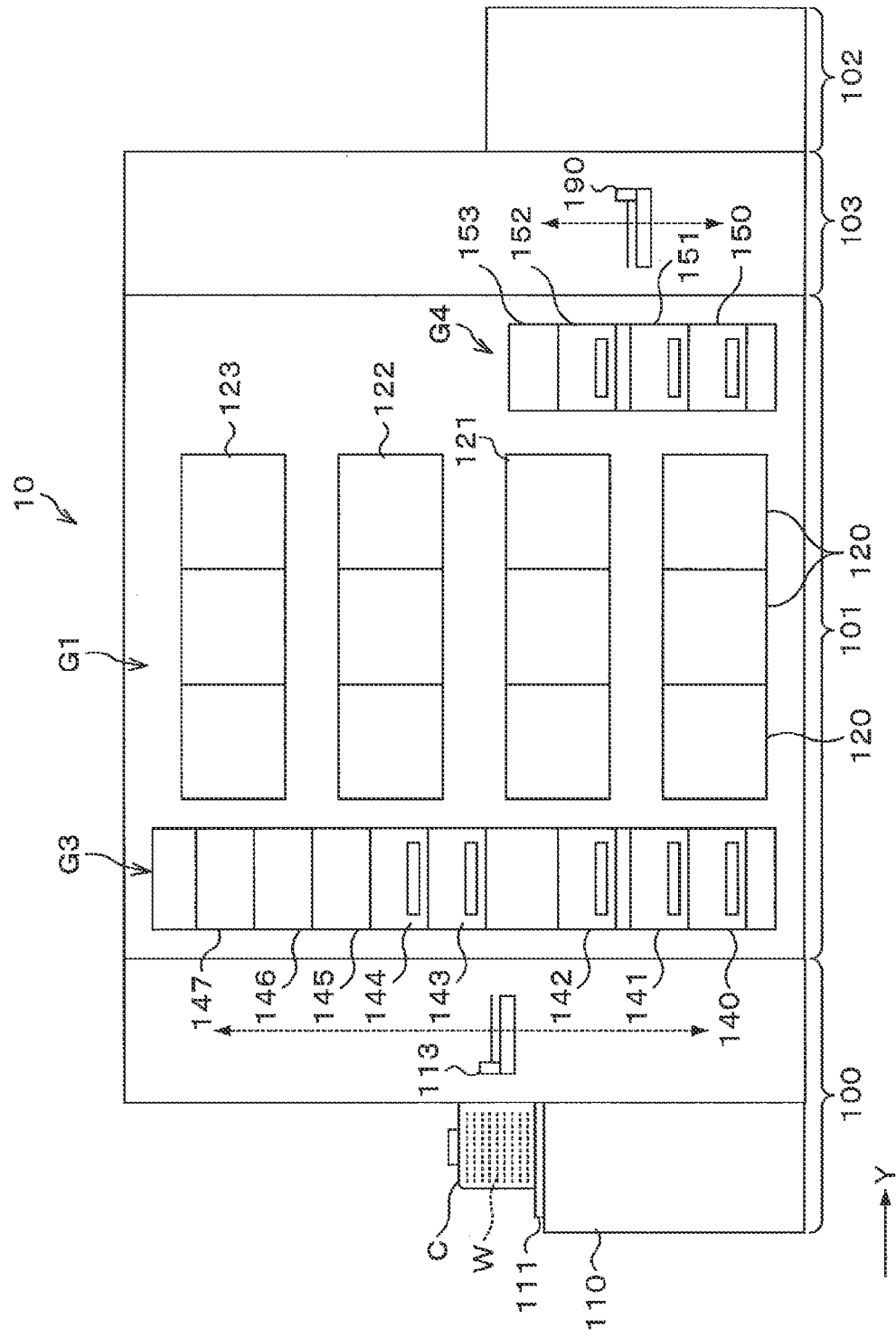
FIG. 3 is a view illustrating an outline of an internal configuration on a front side of the wafer processing system.
Figure 4:
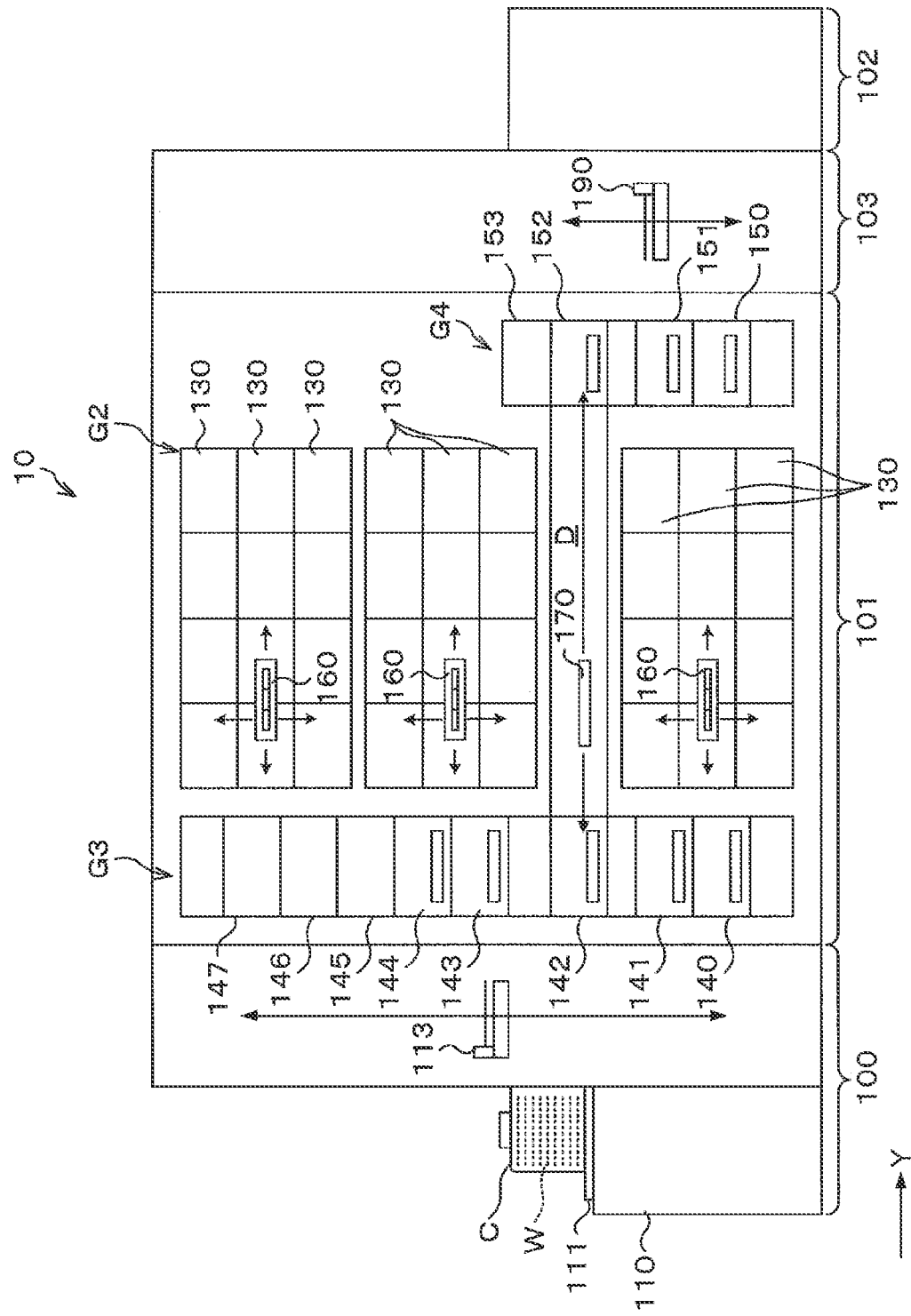
FIG. 4 is a view illustrating an outline of an internal configuration on a rear side of the wafer processing system.

FIG. 2 is a plan view schematically illustrating an outline of a configuration of the wafer processing system 10. FIGS. 3 and 4 are views illustrating, respectively, outlines of the internal configurations of the front side and the rear side of the wafer processing system 10.

As illustrated in FIG. 2, the wafer processing system 10 includes a cassette station 100 in which a cassette C accommodating a plurality of wafers W is carried in and out, and a processing station 101 including a plurality of processing apparatuses each configured to perform a predetermined process on a wafer W. The wafer processing system 10 has a configuration in which the cassette station 100, the processing station 101, and an interface station 103 configured to deliver wafers W to and from an exposure apparatus 102 adjacent to the processing station 101 are integrally connected to each other.

The cassette station 100 is provided with a cassette stage 110. The cassette stage 110 is provided with a plurality of cassette placement plates 111 on each of which a cassette C is placed when the cassette C is carried in and out with respect to the exterior of the wafer processing system 10.

The cassette station 100 is provided with a wafer transfer device 113 that is movable on a transfer path 112 extending in the X direction. The wafer transfer device 113 is also movable in the vertical direction and around the vertical axis (in a θ direction) to be capable of transferring the wafer W between the cassette C on each cassette placement plate 111 and a delivery device of a third block G3 of the processing station 101 to be described later.

The processing station 101 is provided with a plurality of (e.g., four) blocks equipped with various apparatuses, that is, first to fourth blocks G1 to G4. For example, the first block G1 is provided on the front side of the processing station 101 (on the negative side in the X direction in FIG. 2), and the second block G2 is provided on the rear side of the processing station 101 (on the positive side in the X direction in FIG. 2). In addition, the third block G3 is provided on the cassette station 100 side (the negative side in the Y direction in FIG. 2) of the processing station 101, and the fourth block G4 is provided on the interface station 103 side (the positive side in the Y direction in FIG. 2) of the processing station 101.

In the first block G1, a liquid processing apparatus, which is a substrate processing apparatus for processing the wafer W using a processing liquid, is arranged. Specifically, as the liquid processing apparatus, for example, a development apparatus 120, an underlayer film forming apparatus 121, an intermediate layer film forming apparatus 122, and a resist coating apparatus 123 are arranged in this order from the bottom.

The development apparatus 120 develops the wafer W. Specifically, the development apparatus 120 supplies a developer onto the resist film of the wafer W to form a resist pattern.

The underlayer film forming apparatus 121 forms an underlayer film, which is a base film for the resist film of the wafer W. Specifically, the underlayer film forming apparatus 121 applies an underlayer film material, which is a material for forming an underlayer film, onto the wafer W to form the underlayer film.

The intermediate layer film forming apparatus 122 forms an intermediate layer film on the underlayer film of the wafer W at a position below the resist film. Specifically, the intermediate layer film forming apparatus 122 applies an intermediate layer film material, which is a material for forming an intermediate layer film, onto the underlayer film of the wafer W to form the intermediate layer film.

The resist coating apparatus 123 applies a resist liquid to the wafer W to form a resist film. Specifically, the resist coating apparatus 123 applies a resist liquid onto the intermediate layer film of the wafer W to form a resist film.

For example, three development apparatuses 120, three underlayer film forming apparatuses 121, three intermediate layer film forming apparatuses 122, and three resist coating apparatuses 123 are each arranged side by side in the horizontal direction. The number and arrangement of development apparatuses 120, underlayer film forming apparatuses 121, intermediate layer film forming apparatuses 122, and resist coating apparatuses 123 may be arbitrarily selected.

In these development apparatuses 120, underlayer film forming apparatuses 121, intermediate layer film forming apparatuses 122, and resist coating apparatuses 123, for example, a predetermined processing liquid is applied onto the wafer W through a spin coating method. In the spin coating method, for example, a processing liquid is ejected from a coating nozzle onto the wafer W, and the wafer W is rotated so as to spread the processing liquid on the surface of the wafer W.

In the second block G2, heat treatment apparatuses 130, which are substrate processing apparatuses each configured to perform heat treatment such as heating and cooling of the wafer W by using a hot plate or a cooling plate on which the wafer W is placed, are provided side by side in the vertical direction and the horizontal direction. The numbers and arrangement of heat treatment apparatuses 130 may be arbitrarily selected. Further, a known apparatus may be used for each of the heat treatment apparatuses 130.

The third block G3 is provided with a plurality of delivery devices 140, 141, 142, 143, 144, 145, 146, and 147 in this order from the bottom. In addition, the fourth block G4 is provided with a plurality of delivery devices 150, 151, and 152 in this order from the bottom, and an inspection capturing device 153 is provided above the plurality of delivery devices 150, 151, and 152.

Here, a configuration of the inspection capturing device 153 will be described.

Figure 5:
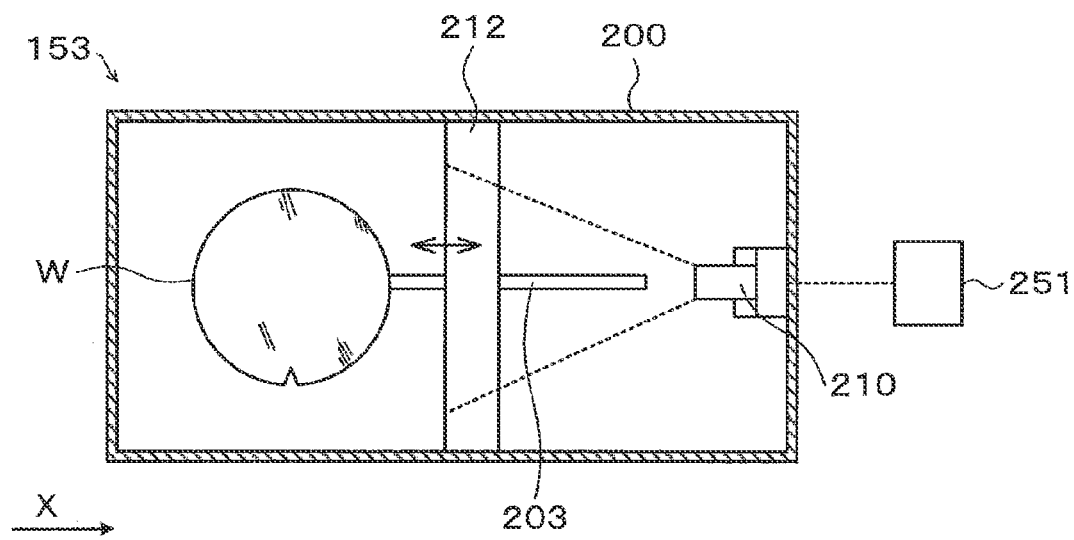
FIG. 5 is a vertical cross-sectional view illustrating an outline of a configuration of an inspection capturing device.
Figure 6:
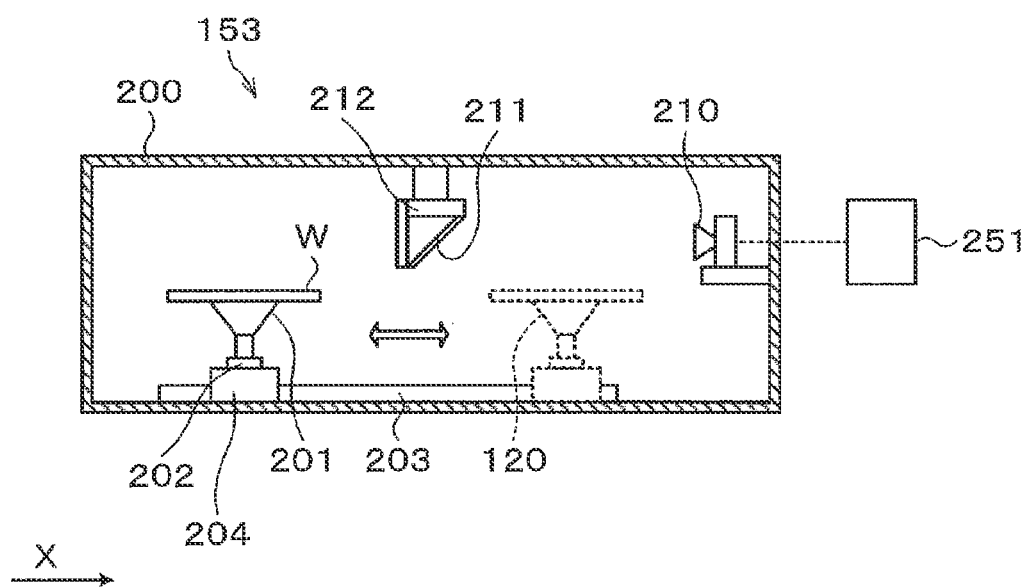
FIG. 6 is a cross-sectional view illustrating an outline of the configuration of the inspection capturing device.

FIGS. 5 and 6 are a vertical cross-sectional view and a horizontal cross-sectional view, respectively, which illustrate the outline of the configuration of the inspection capturing device 153.

The inspection capturing device 153 includes a casing 200, as illustrated in FIGS. 5 and 6, A stage 201 on which the wafer W is placed is provided inside the casing 200. The stage 201 is capable of being rotated and stopped by a rotation driver 202 such as a motor. A guide rail 203 extending from one end side (the negative side in the X direction in FIG. 6) to the other end side (the positive side in the X direction in FIG. 6) is provided on the bottom surface of the casing 200, The stage 201 and the rotation driver 202 are provided on the guide rail 203 to be movable along the guide rail 203 by a driving device 204.

A capturing part 210 is provided on the side surface on the other end side (the positive side in the X direction in FIG. 6) in the casing 200. For example, a wide-angle CCD camera is used for the capturing part 210.

Near the upper center of the casing 200, a half mirror 211 is provided. The half mirror 211 is provided, at a position facing the capturing part 210, with a mirror from a state of being directed vertically downward to a state of being inclined upward 45 degrees toward the capturing part 210, A lighting device 212 is provided above the half mirror 211. The half mirror 211 and the lighting device 212 are fixed to the top surface of the interior of the casing 200. The lighting from the lighting device 212 passes through the half mirror 211 and is illuminated downward. Therefore, the light reflected by an object located below the lighting device 212 is further reflected by the half mirror 211 to be received by the capturing part 210. That is, the capturing part 210 is capable of imaging an object located in the region illuminated by the lighting device 212. In addition the capturing result by the capturing part 210 is input to an imaging control device 251 which will be described later.

The wafer processing system 10 will be described with reference to FIGS. 2 to 4.

As illustrated in FIG. 2, a water transfer region D is formed in a region surrounded by the first to fourth blocks G1 to G4. In the wafer transfer region D, for example, a plurality of wafer transfer devices 160, each of which includes a transfer arm 160a that is movable in the Y direction, the X direction, the θ direction, and the vertical direction, are arranged. The wafer transfer devices 160 move within the wafer transfer region D so as to transfer wafers W to predetermined apparatuses in the first block G1, the second block G2, the third block G3, and the fourth block G4 around the wafer transfer region D.

In addition, as illustrated in FIG. 4, the wafer transfer region D is provided with a shuttle transfer device 170 configured to linearly transfer wafers W between the third block G3 and the fourth block G4.

The shuttle transfer device 170 is configured to be linearly movable, for example, in the Y direction in FIG. 4. The shuttle transfer device 170 moves in the Y direction in the state of supporting the wafer w, and is capable of transferring the wafer W between a delivery device 142 in the third block G3 and a delivery device 152 in the fourth block G4.

As illustrated in FIG. 2, a water transfer device ISO is provided next to the third block G3 on the positive side in the X direction. The wafer transfer device 180 includes a transfer arm 180a that is movable, for example, in the X direction, the θ direction, and the vertical direction. The wafer transfer device 180 is vertically movable in the state of supporting the wafer W so as to transfer the wafer W to each deliver device in the third block G3.

The interface station 103 is provided with a wafer transfer device 190 and a delivery device 191. The wafer transfer device 190 includes a transfer arm 190a that is movable, for example, in the Y direction, the θ direction, and the vertical direction. The wafer transfer device 190 is capable of supporting the wafer W, for example, on the transfer arm 190a so as to transfer the wafer W among each delivery device in the fourth block G4, the delivery device 191, and the exposure apparatus 102.

The wafer processing system 10 is provided with a control device 250.

The control device 250 is, for example, a computer including a processor such as a CPU, a memory, or the like, and includes a program storage (not illustrated). This program storage stores a program for controlling the operation of a driving system of the above-described various processing apparatuses and transfer devices so as to perform wafer processing to be described later. The program storage also stores a program that controls the operation of the capturing part or the driving system of the inspection capturing device 153 to control the process of imaging the wafer W. The program may be recorded in a computer-readable storage medium and installed in the control device 250 from the storage medium. The storage medium may be transitory or non-transitory. Part or all of the program may be implemented by dedicated hardware (circuit board).

The control device 250 acquires a captured image of the wafer W based on the result of capturing the wafer W by the capturing part 210 of the inspection capturing device 153. Specifically, the control device 250 performs a necessary imaging process on an image captured by the capturing part 210, thereby generating, as a captured image of the wafer W, an image illustrating the state of the entire surface of the wafer W.

The captured image of the wafer W generated by the control device 250 is output to the overall control device 20.

Now, the wafer inspection system 1 will be described with reference to FIG. 1.

As described above, the wafer inspection system 1 includes the overall control device 20.

The overall control device 20 is a computer including a processor such as a CPU, a memory, or the like, and includes a storage 260 and a controller 261.

The storage 260 stores various types of information, and includes a memory such as a RAM or a storage device such as an HDD. The storage 260 stores a program or the like for inspection based on the captured image of the wafer W in the controller 261. The program may be recorded in a computer-readable storage medium H, and may be installed on the overall control device 20 from the storage medium H. In addition, the storage medium H may be transitory or non-transitory.

The controller 261 controls the overall control device 20. The controller 261 includes, for example, a processor such as a CPU.

<Wafer Processing>

Next, wafer processing performed by the wafer processing system 10 configured as described above will be described. The following processing is performed based on, for example, a wafer processing recipe set for each lot, and the transfer of the wafer W during processing is performed based on a wafer transfer recipe corresponding to the above-mentioned processing recipe. The processing recipe and the transfer recipe are stored in a storage (not illustrated).

First, a cassette C accommodating a plurality of wafers W is carried into the cassette station 100. Then, under the control of the control device 250, the wafer W is transferred to the underlayer film forming apparatus 121 of the first block G1 to form an underlayer film on the wafer W.

Subsequently, the wafer W is transferred to an underlayer film heat treatment apparatus 130 of the second block G2, and heat treatment of the underlayer film is performed.

Thereafter, the wafer W is transferred to the inspection capturing device 153. Then, under the control of the control device 250, the capturing part 210 performs capturing of the wafer W after forming the underlayer film, and a captured image of the water W after forming the underlayer film is acquired. The acquired captured image of the wafer W is associated with the identification information of the wafer W and output to the overall control device 20. In addition, the captured image of the wafer W is associated with the identification information of a transfer recipe applied to the wafer W (specifically, a transfer recipe that shows a route to the inspection capturing device 153), and is output to the overall control device 20. The captured image of the wafer W output to the overall control device 20 is stored in the storage 260.

Subsequently, under the control of the control device 250, the wafer W is transferred to the intermediate layer film forming apparatus 122 of the first block G1 and an intermediate layer film is formed on the underlayer film of the wafer W.

Subsequently, the wafer W is transferred to an intermediate layer heat treatment apparatus 130 of the second block G2, and heat treatment of the intermediate layer film is performed.

Thereafter, the wafer W is transferred to the resist coating apparatus 123 of the first block G1, and a resist film is formed on the intermediate layer film of the wafer W.

Subsequently, the wafer W is transferred to a PAB processing heat treatment apparatus 130 of the second block G2, and PAB processing is performed thereon.

Subsequently, the wafer W is transferred to the exposure apparatus 102 and exposed with a desired pattern.

Subsequently, the wafer W is transferred to a PEB processing heat treatment apparatus 130 of the second block G2, and PEB processing is performed thereon.

Subsequently, the wafer W is transferred to the development apparatus 120 of the first block G1, and the development process is performed to form a resist pattern thereon.

Thereafter, the wafer W is transferred to a post-baking heat treatment apparatus 130 of the second block G2 where post-baking is performed thereon. Then, the wafer W is returned to the cassette C, and a series of processes on the wafer are completed.

The above-described wafer processing is also performed for other wafers W.

When processing recipes and transfer recipes are different, capturing timing by the inspection capturing device 153 may also differ. For example, in the foregoing example, capturing of the wafer W is performed by the inspection capturing device 153 after the formation of an underlayer film and before the formation of an intermediate layer film, but the capturing of the wafer W may be performed by the inspection capturing device 153 after the development process.

<Overall Control Device 20>

Figure 7:
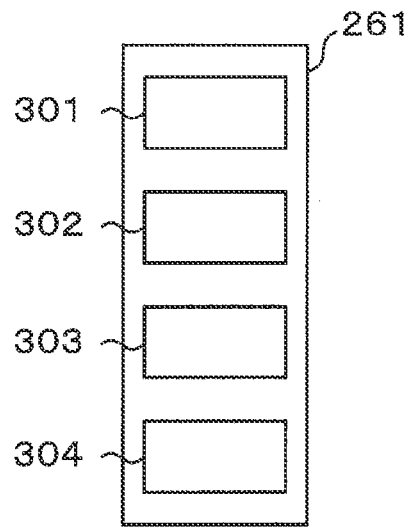
FIG. 7 is a functional block diagram of a controller of an overall control device for wafer inspection based on a captured image of a wafer W.

FIG. 7 is a functional block diagram of the controller 261 of the overall control device 20 related to wafer inspection based on a captured image of the wafer W.

As illustrated in FIG. 7, the controller 261 includes a setting part 301, an inspection part 302, a recipe creation part 303, and a determination part 304, which are implemented by reading and executing a program stored in the storage 260 by a processor such as a CPU.

The setting part 301 defines a group according to a basic state (normal state) of the wafer W, and sets the defined group for each wafer W. The basic state of the wafer W is a state that does not depend on the presence or absence of a defect in the wafer W. The basic state of the wafer W changes depending on, for example, the thickness and type of a film on the outermost surface of the wafer W, the shape and pitch of a pattern formed by the film on the outermost surface, and the like. In addition, the basic state of the wafer W also changes depending on the thickness and type of the base film for the outermost surface film, the shape and pitch of the pattern formed by the base film, and the like. The setting part 301 defines the above-mentioned group based on pixel values (pixel brightness values) of a captured image that vary depending on to the laminated state of films in such the wafer W.

The inspection part 302 inspects a defect of an inspection target wafer W based on the captured image of the inspection target wafer W and an inspection recipe corresponding to the group to which the inspection target wafer W belongs.

The inspection recipe includes at least a reference image to be compared with the captured image of the inspection target wafer W and to serve as a reference for defect inspection.

The inspection recipe includes defect conditions (that is, parameters for defect inspection) for detecting a defect based on the comparison result between the captured image of the inspection target wafer W and the reference image.

The defect conditions include, for example, a set of a condition regarding a pixel value to be detected as a defect, a condition regarding a defect size, and a condition regarding the position of a region in which defect detection is not performed.

The condition regarding a pixel value to be detected as a defect is, for example, a threshold value regarding differences in pixel values between the captured image of the inspection target wafer W and the reference image, and a portion in which a difference in pixel values exceeds the threshold value is detected as a defect.

The condition regarding a defect size is, for example, a threshold value regarding the size of a portion detected as a defect detected based on the condition regarding a pixel value to be detected as a defect, and only the portion in which the size exceeds the threshold value is detected as a defect.

The condition regarding the position of a region in which defect detection is not performed is specifically an adjustment amount of the size or position of a region in which defect detection is not performed, that is, a pseudo defect region.

The defect conditions may include, for example, a set of a condition regarding the adjustment amount of pixel values of the reference image in the entire wafer plane, a condition regarding the defect size, and a condition regarding the adjustment amount of pixel values of each region of the reference image divided in the radial direction of the wafer W.

Appropriate defect conditions differ for each reference image.

The recipe creation part 303 creates an inspection recipe for each group to which wafers W belong.

The determination part 304 determines whether the wafer W, which is an inspection target and a group-setting target by the setting part 301, belongs to a group defined by the setting part 301.

Specifically, the determination part 304 performs the above-mentioned determination based on the following (1) and (2).
  (1) Whether processes performed on the wafers W match each other between a group-setting target wafer W and the wafer W that belongs to the defined group
  (2) Whether the basic state of a group-setting target wafer W, which is estimated from a captured image of the group-setting target wafer W, and the basic state of the wafer W belonging to the defined group match each other Specifically, the (1) above is whether transfer recipes match each other between the group-setting target wafer W and the wafer W belonging to the defined group. That is, the (1) above is whether the transfer recipe associated with the captured image of the group-setting target wafer W and the transfer recipe associated with the defined group as will be described later match each other.

Specifically, the (2) above is whether, within the range of a feature amount in a captured image (hereinafter, referred to as an "image-based feature amount") of the wafer W, corresponding to the basic state of the wafer belonging to the defined group, the image-based feature amount of the group-setting target wafer W falls.

When the image-based feature amount of the group-setting target wafer W falls within the range of the image-based feature amount of the wafer W, which should belong to the defined group, it means that, between the group-setting target wafer W and the wafer W that belongs to the defined group, the transfer recipes as well as the processes performed before the processes performed based on the transfer recipes match each other. For example, when there are a plurality of image-based feature amounts that serve as references for the range of the image-based feature amounts, the range of the image-based feature amounts is determined by the Mahalanobis distance from the distribution of the plurality of image-based feature amounts. This is not applied to the case in which there is a single image-based feature amount that serves as a reference of the range of the image-based feature amounts.

The image-based feature amounts are, for example, feature amounts related to an in-plane tendency of pixel values in a captured image of the wafer W.

More specifically, the feature amounts related to the in-plane tendency are, for example, as follows. For example, a planar distribution of pixel values in a captured image of the wafer W may be decomposed into respective in-plane tendency components of a plurality of pixel values by using the Zernike polynomial. Thus, it is possible to calculate the Zernike coefficients of respective in-plane tendency components. For example, the Zernike coefficients of respective in-plane tendency components correspond to the feature amounts related to the in-plane tendency.

The image-based feature amounts may include a feature amount related to a unit region (e.g., an exposure shot) of a captured image of the wafer W. The unit region referred to here is one region when the surface of the wafer W is divided at predetermined intervals. For example, an exposure shot, which is one exposure region unit when a target range is divided and exposure is performed in the exposure process of a film on the wafer W performed before the wafer W is carried into the wafer processing system 10, corresponds to the unit region.

Specifically, the feature amounts related to the unit region of a captured image of the wafer W are, for example, the pixel values of the unit region, the average value thereof, or the like, and the feature amounts may be differences in pixel values when compared with a corresponding unit region in the reference image. In addition, the feature amounts related to the unit region of a captured image of the wafer W may include a pitch of the unit region. The unit region may be specified based on the position and size information thereof stored in advance in the storage 260, or may be specified by analyzing a captured image.

The determination part 304 determines that a group-setting target wafer W does not belong to the defined group when at least one of the following conditions is satisfied:
  regarding (1) above, between a group-setting target wafer W and the wafer W that belongs to the defined group, the processes performed on the wafers W shall not match each other, and
  regarding (2) above, the basic state of a group-setting target wafer W that is estimated from a captured image of the wafer W, and the basic state of the wafer W belonging to the defined group shall not match each other.

In particular, the determination part 304 also determines that a group-setting target wafer W does not belong to the defined group in the following cases.

That is, regarding (1) above, even when the processes performed on the wafers W match each other, between the group-setting target wafer W and the wafer W belonging to the defined group, that is, even when the transfer recipes match each other.
  the determination part 304 also determines that the group-setting target wafer W does not belong to the defined group when, regarding (2) above, the basic state of the group-setting target wafer W that is estimated from a captured image of the group-setting target wafer W and the basic state of the wafer W belonging to the defined group do not match each other. It can be said that the determination part 304 determines whether the basic states based on the thicknesses or types of films formed on the group-setting target wafer W and a pattern or pitch of each film are comprehensively the same as the basic states corresponding to the defined group, from a captured image of the wafer W.

When the determination part 304 determines that a group-setting target wafer W belongs to the defined group, the setting part 301 sets the corresponding group for the group-setting target wafer W. After the setting, when an inspection recipe corresponding to the above-mentioned corresponding group has been created, the inspection part 302 performs defect inspection on the wafer W, for which the group has been set, based on the captured image of the wafer W and the inspection recipe corresponding to the set group.

Meanwhile, when the determination part 304 determines that the group-setting target wafer W does not belong to the defined group, the setting part 301 defines a new group and sets the group for the group-setting target wafer W. In addition, the setting part 301 associates the new group with the conditions of the wafer W, which should belong to the corresponding new group. Specifically, the transfer recipe of the wafer W, which should belong to the corresponding new group is associated with the range of the image-based feature amounts of the corresponding wafer W.

When the above-mentioned new group is set for the group-setting target wafer W by the setting part 301, the recipe creation part 303 creates an inspection recipe corresponding to the above-mentioned new group based on a captured image of the group-setting target wafer W, that is, a captured image of the wafer W for which the new group has been set. Specifically, the recipe creation part 303 creates an inspection recipe corresponding to the above-mentioned new group based on captured images of a plurality of wafers W for which the above-mentioned new group is set.

A known method may be used as a method for generating a reference image for defect inspection included in an inspection recipe from captured images of a plurality of wafers W. In this known method, capturing of wafers W that satisfy a specific condition and are presumed to have no defect, are extracted from images of a plurality of wafers W, and the above-mentioned reference image is generated based on the extracted captured images of wafers W.

In addition, when determining the above-mentioned defect conditions included in an inspection recipe from a plurality of captured images, for example, the recipe creation part 303 adjusts the defect conditions such that no defect is detected when performing inspection, based on the generated reference image, on each of the extracted captured images of wafers W used for generating the reference image. For example, from among the extracted captured images of the wafers W, a pixel value of a captured image having a large difference in pixel values when compared with the reference image is selected and used as a reference of a threshold value in the range of defect conditions. The pixel value may be used as it is as a threshold value in the defect conditions, or a value obtained by multiplying the pixel value by a predetermined coefficient may be used as a threshold value. When determining defect conditions for each position or region (a detection region unit) in the plane of an integral multiple of wafers W, a pixel value in a captured image having a large difference in the pixel value for each detection region unit may be selected and used as a threshold value in the defect conditions. When a region including a plurality of pixels is used as a detection region unit, defect conditions is determined by the same method as described above based on the average pixel value within the region.

An inspection recipe is created by the setting part 301, for example, as follows.

First, a coefficient for an overall pixel value distribution in the in-plane of the wafer W (an example of a condition regarding the adjustment amount of pixel values in the entire in-plane of the wafer W) is set. This coefficient is a constant oft or more and is multiplied by each pixel value at each position in the above-mentioned luminance distribution, and is set such that all of the products of pixel values at respective positions in the extracted captured image of the wafer W and the coefficient are to be outside the range of a defect condition (that is, defect-free) Next, an offset value is determined for each of an inner region in which the radial range of the wafer W is narrower than the range to which the above-mentioned coefficient is related and an outer region located outside the inner region. The offset value is an example of a condition regarding the adjustment amount of the pixel value of each region divided in the radial direction of the wafer W. Specifically, in a value added to the product of the pixel value at each position and the above coefficient, the maximum value that can be taken on the premise that the value obtained as a result of the addition does not fall within the range of the defect condition in each of the inner region and the outer region is set as the offset value through, for example, a verification result for a plurality of predetermined candidate values.

Even when a pattern is formed on an inspection target wafer W, an inspection recipe including the above-mentioned defect conditions is determined and created without using design data (specifically, CAD data) related to the pattern.

When a new inspection recipe corresponding to the new group is created, the inspection part 302 performs detect inspection, based on the captured image of the wafer W and the new inspection recipe, on the wafer W that belongs to the new group and has not been inspected.

<Inspection Process and Pre-Process for Inspection>

Next, an inspection process and a pre-process for inspection by the overall control device 20 will be described. First, the pre-process for inspection will be described.

Figure 8:
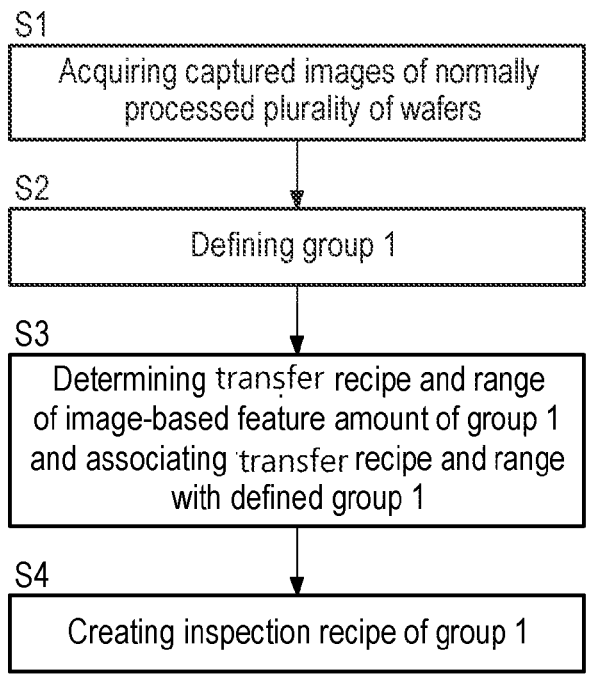
FIG. 8 is a flowchart illustrating an example of a pre-process for inspection by the overall control device.

FIG. 8 is a flowchart illustrating an example of a pre-process for inspection by the overall control device 20.

In the pre-process for inspection, for example, as illustrated in FIG. 8, first, the controller 261 acquires captured images of a plurality of wafers W, which should belong to the same group and have been normally processed (i.e., defect-free) (step S1). Here, the captured images acquired by the controller 261 are selected by, for example, a user.

Subsequently, the controller 261 defines the group of wafers W, of which the captured images are acquired, as a group 1 (step S2).

In addition, the controller 261 determines a transfer recipe of the wafers W, which should belong to the group 1 and a range of image-based feature amounts of the wafers W, which should belong to the group 1 as the conditions of the wafers W, which should belong to the group 1, and associates the transfer recipe and the range with the group 1 (step S3). As the transfer recipe for the wafers W, which should belong to the group 1, for example, the transfer recipe associated with a captured image acquired in step S1 is used. In addition, the range of image-based feature amounts of the wafers W, which should belong to the group 1, is determined from the captured images acquired in step S1.

In addition, the recipe creation part 303 determines the inspection recipe corresponding to the group I based on the captured images of the plurality of wafers W acquired in step S1 (step S4).

With this, a series of pre-processes for inspection are completed. This pre-process may be omitted.

Next, the inspection process by the overall control device 20 will be described.

FIG. 9 is a flowchart illustrating an example of an inspection process by the overall control device 20.

First, the determination part 304 acquires a captured image of an inspection target wafer W from the storage 260 (step S11).

Subsequently, in order to set a group for the inspection target water W, the determination part 304 determines whether the transfer recipe associated with the captured image of the inspection target wafer W matches a transfer recipe associated with any of the defined groups (step S12).

When the transfer recipes match each other (step S12, "YES"), for each group having the matching recipe, the determination part 304 determines whether image-based feature amounts of an inspection target wafer W fall within the range of image-based feature amounts of the wafers W which should belong to the group (step S13).

Regarding any group having the matching recipe, when the image-based feature amounts of an inspection target wafer W fall within the range of image-based feature amounts of the wafers W, which should belong to the group (step S14, "YES"), the setting part 301 sets the corresponding group for the inspection target wafer W (step S15).

Then, when an inspection recipe has already been created for the group set for the inspection target wafer W (step S16, "YES"), the inspection part 302 performs defect inspection based on the captured image of the inspection target wafer W and the already created recipe (step S17). Thereafter, the controller 261 returns the process to step S1 for the next wafer W.

When no inspection recipe is created for the group set for the inspection target wafer W (steps S16, "NO"), the recipe creation part 303 determines whether the number of inspection target wafers W for which the same group is set exceeds a threshold value (step S18).

When the threshold value is not exceeded ("NO"), the controller 261 returns the process to step S1, and when the threshold value is exceeded ("YES"), the recipe creation part 303 creates an inspection recipe corresponding to the corresponding group based on the captured image of the inspection target wafer W, which corresponds to the number exceeding the threshold value (step S19).

Subsequently, the inspection part 302 performs defect inspection, based on the captured image of the wafer W and the created inspection recipe, on each of the wafers W belonging to the group for which the inspection recipe is created (step S20). Thereafter, the controller 261 returns the process to step S1 for the next wafer W.

In addition, in step S12, when the transfer recipe associated with the captured image of an inspection target wafer W does not match any of transfer recipes associated with defined groups ("NO"), the setting part 301 defines a new group and sets the group for the inspection target wafer W (step S21). The setting part 301 associates the new group with a transfer recipe and a range of image-based feature amounts of the wafers W, which should belong to the new group (step S22). Thereafter, the controller 261 returns the process to step S1 for the next wafer W.

In step S14, for any group having the matching recipe as well, even when the image-based feature amounts of an inspection target wafer W do not fall within the image-based feature amounts of the wafers W which should belong to the corresponding group ("NO"), the process proceeds as in the case of "NO" in step S12.

SPECIFIC EXAMPLES

Here, cases in which inspection is performed for the first time according to the flowchart illustrated in FIG. 9 after the pre-process for the above-described inspection when an inspection-target wafer W corresponds to each of the following (A), (B), and (C) may be considered.

(A) A case in which the inspection target wafer W is the same in transfer recipe and image-based feature amount as the wafer W, a captured image of which was used in the pre-process for inspection (that is, the case in which the inspection target wafer W is the wafer W1 which should belong to a group 1 defined in the pre-process for inspection)

In this case, the inspection process proceeds in the order of step S11→step S12→step S13→step S14→step S15→step S16→step S17. The group 1 defined in the pre-process for inspection is set for the inspection target wafer W1, and the wafer W1 is inspected based on the inspection recipe created in the pre-process for inspection and corresponding to the group 1.

(B) A case in which the inspection target wafer W is different in transfer recipe from the wafer W, a captured image of which was used in the pre-process for inspection (that is, the case in which the inspection target wafer W is the wafer W2 to which a transfer recipe R2 different from the transfer recipe R1 for the above-mentioned wafer W1 is applied)

In this case, the inspection process proceeds in the order of step S11→step S12→step S21→step S22. Then, a new group 2 is defined and set for the inspection target wafer W2, and the transfer recipe R2 and the range A2 of the image-based feature amount of the wafer W, which should belong to the group 2, are associated with the new group 2.

For the second and subsequent inspection target wafers W2 until the threshold value is exceeded in step S18, the inspection process proceeds in the order of step S11→step S12 step S13→step S14→step S15→step S16→step S18→step S1. As a result, the group 2 defined based on the first inspection target wafer W2 is set for each wafer W2, However, inspection is not performed at this point.

For the inspection target wafers W2 that exceed the threshold value in step S18, the process proceeds in the order of S11→step S12→step S13→step S14→step S15→step S16→step S18→step S19→step S20. As a result, the group 2 defined based on the first inspection target wafer W2 is set for the second and subsequent inspection target wafers W2, and an inspection recipe corresponding to the group 2 is created based on the captured images of the plurality of inspection target wafers W2, in addition, each of the wafers W2 for which the group 2 has been set is inspected based on the created inspection recipe.

For the inspection target wafers W2 after the inspection recipe is created, the inspection process proceeds in the order of step S11→step S12→step S13→step S14→step S15→step S16→step S17. Then, the group 2 is set for the inspection target wafers W2, and the inspection target wafers W2 are inspected based on the inspection recipe created as described above and corresponding to the group 2.

(C) A case in which the inspection target wafer W is the same in transfer recipe as, but different in image-based feature amount from the wafer W, a captured of which was used in the pre-process for inspection (that is, the case in which the inspection target wafer W is the wafer W3 to which the same transfer recipe R1 as the above-mentioned wafer W1 is applied and which is different in image-based feature amounts from the wafer W1)

In this case, the inspection process proceeds in the order of step S11→step S12→step S13→step S14→step S21→step S22. Then, a new group 3 is defined and set for the inspection target wafer W3, and a transfer recipe R3 and a range A3 of an image-based feature amount of the wafer W, which should belong to the new group 3, are associated with the new group 3.

For the second and subsequent inspection target wafers W3 until the threshold value is exceeded in step S18, the inspection process proceeds in the order of step S11→step S12→step S13=step S14→step S15→step S16→step S18→step S1. As a result, the group 3 defined based on the first inspection target wafer W2 is set for each wafer W3. However, inspection is not performed at this time point.

For the inspection target wafers W2 that exceed the threshold value in step S18, the process proceeds in the order of S11→step S12→step S13→step S14→step S15→step S16→step S18→step S19→step S20. As a result, the group 3 defined based on the first inspection target wafer W is set for the second and subsequent inspection target wafers W3, and an inspection recipe corresponding to the group 3 is created based on the captured images of the plurality of inspection target wafers W3. In addition, each of the wafers W2 for which the group 3 has been set is inspected based on the created inspection recipe.

For the inspection target wafers W3 after the inspection recipe is created, the inspection process proceeds in the order of step S11→step S12→step S13→step S14→step S15→step S16→step S17. Then, the group 3 is set for the inspection target wafers W3, and the inspection target wafers W3 are inspected based on the inspection recipe created as described above and corresponding to the group 3.

<Main Effects of Technique of Present Disclosure>

As described above, the inspection method according to the present embodiment includes: a step of defining a group according to the basic state of the wafer W and setting the defined group for each inspection target wafer W; a step of detecting a defect based on a captured image of an inspection target wafer W and an inspection recipe corresponding to a group to which the inspection target wafer W belongs and which includes a reference image; a step of creating an inspection recipe for each group; and a step of performing a determination as to whether a group-setting target wafer W belongs to a defined group. In addition, in the step of performing the determination, the determination is performed based on whether processes performed on the wafers W match each other between the inspection target wafer W in the group and the wafer W belonging to the defined group, and whether the basic state of the inspection target wafer W that is estimated from the captured image of the group-setting target wafer W and the basic state of the wafer W belonging to the defined group match each other. As a result of the determination, when it is determined that the group-setting target wafer W belongs to the defined group, in the setting step, the corresponding group is set for a group-setting target wafer W. In addition, when it is determined that the group-setting target water W does not belong to the defined group, in the setting step, a new group is defined and set for the group-setting target wafer W, and in the recipe creating step, an inspection recipe corresponding to the new group is created based on the captured image of the group-setting target wafer W.

Therefore, in the present embodiment, when there is no inspection recipe suitable for the inspection target wafer W, an inspection recipe suitable for the inspection target wafer W is created based on the captured image of the inspection target wafer W. Accordingly, it is not necessary to prepare an inspection recipe in advance, or the number of inspection recipes to be created in advance may be the minimum. Accordingly, it is possible to reduce the time and effort required at the time of startup of the wafer inspection system 1. In addition, in the present embodiment, for each inspection target wafer W, an inspection recipe suitable for the wafer W. Therefore, it is possible to perform defect inspection with high accuracy. That is, according to the present embodiment, it is possible to perform defect inspection based on a captured image of the wafer with high accuracy while suppressing an increase in effort at the time of startup.

In the present embodiment, it is not necessary to use design data (CAD data) regarding a pattern formed on the wafer W for creating an inspection recipe. Therefore, it is possible to reduce the effort of inputting design data for teaching in advance. That is, according to the present embodiment, while various wafers W are processed, even if there is no prior data input, it is possible to perform an autonomous process of determining whether the existing type group is a new group and performing inspection according to the determination result.

Design data is unnecessary for adjusting the conditions of a coating process or the heat treatment in the wafer processing system 10.

In the present embodiment, a group is set for an inspection target wafer W, and the defect of the inspection target wafer W is inspected based on an inspection recipe corresponding to the group. Then, the group setting for the inspection target wafer W is performed based on the transfer recipe of the inspection target wafer W and the image-based feature amount of the inspection target wafer W. That is, a user's operation is unnecessary for group setting for the inspection target wafer W, and the group setting may be automatically performed by the setting part 301. Therefore, the user's effort can be reduced.

Furthermore, according to the present embodiment, even if transfer recipes for inspection target wafers W are the same, different inspection recipes may be used for the inspection target wafers W when the image-based feature amounts thereof are different. Therefore, it is possible to perform defect inspection with higher accuracy.

<Modification>

An inspection recipe corresponding to each group may be recreated at a predetermined timing based on captured images of a plurality of wafers W belonging to the group. The predetermined timing is every lot, every time a predetermined number of wafers W are processed, and every time a predetermined time elapses. As a result, it is possible to perform defect inspection based on an inspection recipe with higher accuracy.

When an inspection recipe is recreated, the wafer W inspected based on an old inspection recipe may be subjected to defect inspection based on the recreated new inspection recipe.

According to the present disclosure, it is possible to perform defect inspection based on a captured image of a substrate with high accuracy while suppressing an increase in effort at the time of startup.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate inspection device for inspecting a substrate, comprising:
 a setting part configured to define a group according to a basic state that is not dependent on a presence or absence of a defect in a substrate and set the defined group for each inspection target substrate;
 an inspection part configured to perform a defect inspection based on a captured image of the inspection target substrate and an inspection recipe corresponding to the defined group to which the inspection target substrate belongs and including a reference image;
 a recipe creation part configured to create the inspection recipe for each group; and
 a determination part configured to perform a determination as to whether a group-setting target substrate, for which the group is set by the setting part, belongs to the group defined by the setting part,
 wherein the determination part performs the determination based on: whether processes performed on the substrates match each other between the group-setting target substrate and the substrate that belongs to the defined group; and whether the basic state of the group-setting target substrate estimated from a captured image of the group-setting target substrate and the basic state of the substrate that belongs to the defined group match each other,
 when the group-setting target substrate is determined to belong to the defined group, the setting part sets the corresponding group for the group-setting target substrate, and
 when the group-setting target substrate is determined to not belong to the defined group, the setting part defines a new group and sets the new group for the group-setting target substrate, and the recipe creation part creates the inspection recipe corresponding to the new group based on a captured image of the group-setting target substrate.

2. The substrate inspection device of claim 1, wherein, when at least one of a condition that, between the group-setting target substrate and the substrate that belongs to the defined group, the processes performed on the substrates do not match each other and a condition that the basic state of the group-setting target substrate estimated from a captured image of the group-setting target substrate and the basic state of the substrate which belongs to the defined do not match each other is satisfied, the determination part determines that the group-setting target substrate does not belong to the defined group.

3. The substrate inspection device of claim 2, wherein, when, between the group-setting target substrate and the substrate belongs to the defined group, the processes performed on the substrates match each other, but the basic state of the group-setting target substrate estimated from the captured image of the group-setting target substrate and the basic state of the substrate that belongs to the defined group do not match each other, the determination part determines that the group-setting target substrate does not belong to the defined group.

4. The substrate inspection device of claim 1, wherein the inspection recipe includes defect conditions for detecting a defect based a comparison result between the captured image of the inspection target substrate and the reference image.

5. The substrate inspection device of claim 1, wherein the defect conditions include a condition regarding a pixel value to be detected as a defect, a condition regarding a defect size, and a condition regarding a position of a region in which the detect inspection is not performed.

6. The substrate inspection device of claim 5, wherein the defect conditions include a condition regarding an adjustment amount of a pixel value in an entire substrate plane, the condition regarding the defect size, and a condition regarding an adjustment amount of a pixel value of each region divided in a radial direction of the substrate.

7. The substrate inspection device of claim 1, wherein a pattern is formed on the inspection target substrate, and
 the recipe creation part creates the inspection recipe without using design data related to the pattern.

8. The substrate inspection device of claim 1, wherein, whether the basic state of the group-setting target substrate estimated from the captured image of the group-setting target substrate and the basic state of the substrate, which belongs the defined group, match each other is determined based on whether a feature amount in a captured image corresponding to the basic state of the group-setting target substrate falls within a range of a feature amount in a captured image corresponding to the basic state of the substrate, which belongs to the defined group.

9. The substrate inspection device of claim 8, wherein the feature amount in the captured image is a feature amount regarding an in-plane tendency of pixel values in the captured image.

10. The substrate inspection device of claim 1, wherein, when the group-setting target substrate is determined to not belong to the defined group, the recipe creation part creates the inspection recipe corresponding to the new group based on captured images of a plurality of group-setting target substrates.

11. The substrate inspection device of claim 1, wherein the recipe creation part recreates the inspection recipe corresponding to the group at a predetermined timing based on the captured images of a plurality of substrates belonging to the group.

12. A substrate inspection method of inspecting a substrate, the substrate inspection method comprising:
 defining a group according to a basic state that is not dependent on a presence or absence of a defect in a substrate and setting the defined group for each inspection target substrate;
 performing a defect inspection based on a captured image of the inspection target substrate and an inspection recipe corresponding to the defined group to which the inspection target substrate belongs and including a reference image;
 creating the inspection recipe for each group; and
 performing a determination as to whether the group-setting target substrate belongs to the defined group,
 wherein, in the performing the determination, the determination is performed based on: whether processes performed on the substrates match each other between the group-setting target substrate and the substrate that belongs to the defined group; and whether the basic state of the group-setting target substrate estimated from a captured image of the group-setting target substrate and the basic state of the substrate that belongs to the defined group match each other,
 when the group-setting target substrate is determined to belong to the defined group, in the setting the defined group, the corresponding group is set for the group-setting target substrate, and
 when the group-setting target substrate is determined to not belong to the defined group, in the setting the defined group, a new group is defined and the new group is set for the group-setting target substrate, and in the creating the inspection recipe, the inspection recipe corresponding to the new group is created based on a captured image of the group-setting target substrate.

13. The substrate inspection method of claim 12, wherein in the performing the determination, when at least one of a condition that, between the group-setting target substrate and the substrate that belongs to the defined group, the processes performed on the substrates do not match each other and a condition that the basic state of the group-setting target substrate estimated from a captured image of the group-setting target substrate and the basic state of the substrate which belongs to the defined do not match each other is satisfied, the group-setting target substrate is determined to not belong to the defined group.

14. The substrate inspection method of claim 12, wherein in the creating the inspection recipe, the inspection recipe includes defect conditions for detecting a defect based a comparison result between the captured image of the inspection target substrate and the reference image, and
the detect conditions include a condition regarding a pixel value to be detected as a defect, a condition regarding a defect size, and a condition regarding a position of a region in which the detect inspection is not performed.

15. The substrate inspection method of claim 12, wherein in the creating the inspection recipe, the inspection recipe is created without using design data related to a pattern formed on the inspection target substrate.

16. The substrate inspection method of claim 12, wherein in the performing the determination, whether the basic state of the group-setting target substrate estimated from the captured image of the group-setting target substrate and the basic state of the substrate, which belongs the defined group, match each other is determined based on whether a feature amount in a captured image corresponding to the basic state of the group-setting target substrate falls within a range of a feature amount in a captured image corresponding to the basic state of the substrate, which belongs to the defined group.

17. The substrate inspection method of claim 12, wherein in the performing the determination, when the group-setting target substrate is determined to not belong to the defined group,
in the creating the inspection recipe, the inspection recipe corresponding to the new group is created based on captured images of a plurality of group-setting target substrates.

18. A non-transitory computer-readable storage medium that stores a program that operates on a computer of a controller that controls a substrate inspection device so that the substrate inspection method of claim 12 is executed by the substrate inspection device.

* * * * *